US012785051B2

(12) United States Patent
Horikawa et al.

(10) Patent No.: US 12,785,051 B2
(45) Date of Patent: Nov. 3, 2026

(54) PLASMA PROCESSING APPARATUS

(71) Applicant: Hitachi High-Tech Corporation, Tokyo (JP)

(72) Inventors: Kyohei Horikawa, Tokyo (JP); Takamasa Ichino, Tokyo (JP); Shintarou Nakatani, Tokyo (JP); Kazunori Nakamoto, Tokyo (JP); Yuki Tanaka, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 821 days.

(21) Appl. No.: 18/025,018

(22) PCT Filed: Mar. 14, 2022

(86) PCT No.: PCT/JP2022/011436

§ 371 (c)(1),
(2) Date: Mar. 7, 2023

(87) PCT Pub. No.: WO2023/175690

PCT Pub. Date: Sep. 21, 2023

(65) Prior Publication Data

US 2024/0282555 A1 Aug. 22, 2024

(51) Int. Cl.

| | |
|---|---|
| ***H01J 37/32*** | (2006.01) |
| ***H05B 3/56*** | (2006.01) |
| ***H10P 72/72*** | (2026.01) |

(52) U.S. Cl.

CPC .... *H01J 37/32724* (2013.01); *H01J 37/3299* (2013.01); *H05B 3/56* (2013.01); *H10P 72/722* (2026.01); *H01J 2237/334* (2013.01)

(58) Field of Classification Search

CPC ... H05B 1/0233; H05B 3/26; H01L 21/67103; H01L 21/67069; H01L 21/67248;

(Continued)

(56) References Cited

U.S. PATENT DOCUMENTS

| | | | |
|---|---|---|---|
| 9,775,194 | B2 | 9/2017 | Pease et al. |
| 10,361,089 | B2 | 7/2019 | Kaneko et al. |

(Continued)

FOREIGN PATENT DOCUMENTS

| | | | |
|---|---|---|---|
| CN | 107004626 | A | 8/2017 |
| JP | 2007-067036 | A | 3/2007 |

(Continued)

OTHER PUBLICATIONS

Office Action mailed Sep. 11, 2025 in Taiwanese Application No. 114101797.

(Continued)

*Primary Examiner* — Vy T Nguyen

(74) *Attorney, Agent, or Firm* — Miles & Stockbridge, P.C.

(57) ABSTRACT

An electrostatic chuck 40 has a heater HT1 and a heater HT2 each covered by dielectric films 41 to 45. The heater HT2 is divided into a region HT2*a* having a circular shape in plan view, a region HT2*b* surrounding an outer periphery of the region HT2*a* in plan view, and a region HT2*c* surrounding an outer periphery of the region HT2*a* in plan view. The heater HT1 is divided into a plurality of regions HT1*d*, each having a rectangular shape in plan view. The regions HT2*a* to HT2*c* and the plurality of regions HT1*d* are electrically connected to a control unit C0. The control unit C0 is configured to individually control supply of power to the regions HT2*a* to HT2*c* and the plurality of regions HT1*d*.

8 Claims, 8 Drawing Sheets

(58) Field of Classification Search

CPC ........... H01L 21/6833; H01L 21/67109; H01L 21/6831; H01L 21/67098; H02N 13/00; H01J 37/32724; H01J 2237/334; H01J 37/32192; H01J 37/32009; H01J 37/32082; H01J 37/3244; H01J 37/32522; H01J 37/32532; H01J 37/32568; H01J 37/32715; H01J 37/32825; H01J 37/32963

USPC ........................ 156/345.27, 345.38; 219/458

See application file for complete search history.

(56) References Cited

U.S. PATENT DOCUMENTS

| | | | |
|---|---|---|---|
| 10,582,570 | B2 | 3/2020 | Parkhe |
| 11,265,971 | B2 | 3/2022 | Parkhe |
| 2002/0159216 | A1 | 10/2002 | Ennis |
| 2013/0220989 | A1* | 8/2013 | Pease ................ H01L 21/67103 219/458.1 |
| 2014/0216657 | A1* | 8/2014 | Kusumoto ........ H01L 21/67248 156/345.27 |
| 2015/0060013 | A1 | 3/2015 | Buchberger, Jr. |
| 2015/0170977 | A1 | 6/2015 | Singh |
| 2017/0025255 | A1 | 1/2017 | Tandou et al. |
| 2017/0167790 | A1 | 6/2017 | Gaff et al. |
| 2019/0088517 | A1* | 3/2019 | Kosakai ............ H01L 21/67103 |
| 2023/0131233 | A1 | 4/2023 | Lavdovsky et al. |

FOREIGN PATENT DOCUMENTS

| | | | |
|---|---|---|---|
| JP | 2014-150160 | A | 8/2014 |
| JP | 2015-515713 | A | 5/2015 |
| JP | 2017-028111 | A | 2/2017 |
| JP | 2017-157855 | A | 9/2017 |
| KR | 10-2014-0130215 | A | 11/2014 |
| KR | 10-2017-0088352 | A | 8/2017 |
| TW | 201407708 | A | 2/2014 |
| TW | 201907478 | A | 2/2019 |
| TW | 202130980 | A | 8/2021 |
| TW | 202205485 | A | 2/2022 |

OTHER PUBLICATIONS

Office Action mailed Jun. 14, 2024 in Korean Application No. 10-2023-7005509.

Search Report mailed Apr. 12, 2022 in International Application No. PCT/JP2022/011436.

Written Opinion mailed Apr. 12, 2022 in International Application No. PCT/JP2022/011436.

Office Action mailed Dec. 7, 2023 in Taiwanese Application No. 112105845.

* cited by examiner

| | HEATER HT2 | HEATER HT1 |
|---|---|---|
| HEATING SURFACE AREA | LARGE | SMALL |
| ARRANGED HEATER WIRE | LONG | SHORT |
| RESISTANCE VALUE | HIGH | LOW |
| CURRENT AMOUNT | SMALL | LARGE |

PLASMA PROCESSING APPARATUS

TECHNICAL FIELD

The present invention relates to a plasma processing apparatus, and, more particularly, relates to a plasma processing apparatus including a heater on a sample stage.

BACKGROUND ART

Typically, a plurality of insulating films and a plurality of conductive films are stacked on a surface of a plate-like sample such as a semiconductor wafer (hereinafter simply referred to as "wafer"). These films are etched in a plasma processing apparatus, and the etching processing is performed in a processing chamber of the same plasma processing apparatus without removing the wafer in order to short time.

In such etching processing, the wafer is processed while the temperature of the sample stage disposed in the processing chamber is adjusted to a suitable temperature. Therefore, a heater is built into the sample stage of the plasma processing apparatus. In a case where the wafer is machined, the heater is used to adjust the temperature to a temperature suitable for machining to improve machining accuracy.

For example, Patent Document 1 discloses a technique of forming a ring-shaped heater film provided above a metallic basement constituting the sample stage by thermal spraying. By the heater film, in-wafer temperature distribution can be changed for each etching condition.

Patent Document 2 discloses a plasma processing apparatus including a concentric-circle-shaped first heater element provided above a metallic basement constituting the sample stage, and a second heater element provided below the first heater element. The second heater element is configured to have a concentric circle shape overall by combining a plurality of fan-shaped heater segments. Since the second heater element is divided, the heating amount of the second heater element is smaller than the heating amount of the first heater element. By these two heater elements, the wafer can be etched along with the control for the temperature of the wafer disposed on the sample stage.

RELATED ART DOCUMENTS

Patent Documents

Patent Document 1: Japanese Patent Application Laid-Open Publication No. 2007-67036

Patent Document 2: Japanese Patent Application Laid-Open Publication No. 2017-157855

SUMMARY OF THE INVENTION

Problems to be Solved by the Invention

In recent years, wafer processing conditions have become more complex to handle the high integration and miniaturization of semiconductor devices. For example, in the miniaturization of the semiconductor devices, control for the temperature during plasma processing is required to correspond to the various patterns within the semiconductor devices. Therefore, the sample stage is required to control temperature conditions over a wide range is required, and is required to locally control detailed temperature conditions.

In order to achieve the local temperature control in the miniaturized semiconductor device, it is inevitably necessary to increase the number of divisions of the heater. However, the increase in the number of division of the heater needs to increase in the number of power-feeding structures for each heater, and this undesirably makes the internal structure of the sample stage more complex. There is also the problem that the increase in the number of power-feeding structures increases the number of locations without the temperature control so as to locally increase the number of regions where the temperature is lower than the set temperature. In the case of Patent Document 1, there is a risk of losing of the in-wafer temperature uniformity. Accordingly, the manufacturing yield of the wafer decreases.

In Patent Document 2, the detailed temperature control is achieved more than that of Patent Document 1 because of the second heater element which has a larger number of divisions than the first heater element and a smaller heating amount than the first heater element. However, the chip region of the wafer where the semiconductor device is formed is the region surrounded by the scribe region and is rectangular. Because the second heater element is configured to have the concentric circle shape overall, the more detailed temperature control for the semiconductor device causes the risk of losing of the in-wafer temperature uniformity as similar to Patent Document 1.

The main object of this application is to provide a plasma processing apparatus including a heater capable of increasing in-wafer temperature uniformity. Another object of this application is to suppress a decrease in a manufacturing yield of a wafer by performing a plasma processing (etching processing) using such a plasma processing apparatus.

Other objects and novel characteristics will be apparent from the description of the present specification and the accompanying drawings.

Means for Solving the Problems

The outline of the typical aspects of the embodiments disclosed in the present application will be briefly described as follows.

A plasma processing apparatus according to an embodiment includes: a vacuum vessel; a processing chamber provided inside the vacuum vessel; a cylindrical sample stage provided to the processing chamber on which a wafer to be processed is located; and a control unit. In this case, the sample stage includes a basement connected to a ground potential and an electrostatic chuck that is provided on a top surface of the basement, and an electrode to which radio frequency power is supplied during the processing of the wafer located on the sample stage, the electrostatic chuck has a dielectric film covering an upper surface of the basement, a first heater and a second heater which adjust the temperature of the wafer by heating during the processing of the wafer, each of the first heater and the second heater being covered by the dielectric film, and a metal film disposed above the dielectric film and covers the first and second heaters and is connected to the ground potential, the second heater is provided above the first heater, the second heater is divided into a first region having a circular shape in plan view, a second region surrounding an outer periphery of the first region in plan view, and a third region surrounding an outer periphery of the second region in plan view, the first heater is divided into a plurality of fourth regions, each having a rectangular shape in plan view, each of the first region, the second region, the third region, and the plurality of fourth regions is electrically connected to each of a plurality of Direct Current (DC) power supplies which are each configured to supply individually adjusted power during the processing of the wafer, and the plasma processing apparatus further comprises a plurality of supply paths of DC power, each supply path being connected between each of the first region, the second region, the third region, and the plurality of fourth regions, and each of the plurality of DC power supplies is without a filter.

Effects of the Invention

According to an embodiment, it is possible to provide a plasma processing apparatus including a heater capable of increasing in-wafer temperature uniformity. In addition, a manufacturing yield of the wafer can be decreased by using such a plasma processing apparatus to perform plasma processing.

BRIEF DESCRIPTIONS OF THE DRAWINGS

DETAILED DESCRIPTION OF PREFERRED EMBODIMENTS

Hereinafter, embodiments will be described in detail with reference to the accompanying drawings. Note that components having the same function are denoted by the same reference signs throughout all the drawings for describing the embodiments, and the repetitive description thereof will be omitted. In addition, the description of the same or similar portions is not repeated in principle unless otherwise particularly required in the following embodiments.

Furthermore, an X direction, a Y direction, and a Z direction, which are described in the present application, intersect one another, and are orthogonal to one another. In the present application, the Z direction is described as a vertical direction, a height direction, or a thickness direction of a certain structural body. Expressions such as "plan view" or "planar view," which are used in the present application, mean that the plane constituted by the X and Y directions is a "plane," and that this "plane" is viewed from the Z direction.

First Embodiment

<Configuration of Plasma Processing Apparatus>

Figure 1:
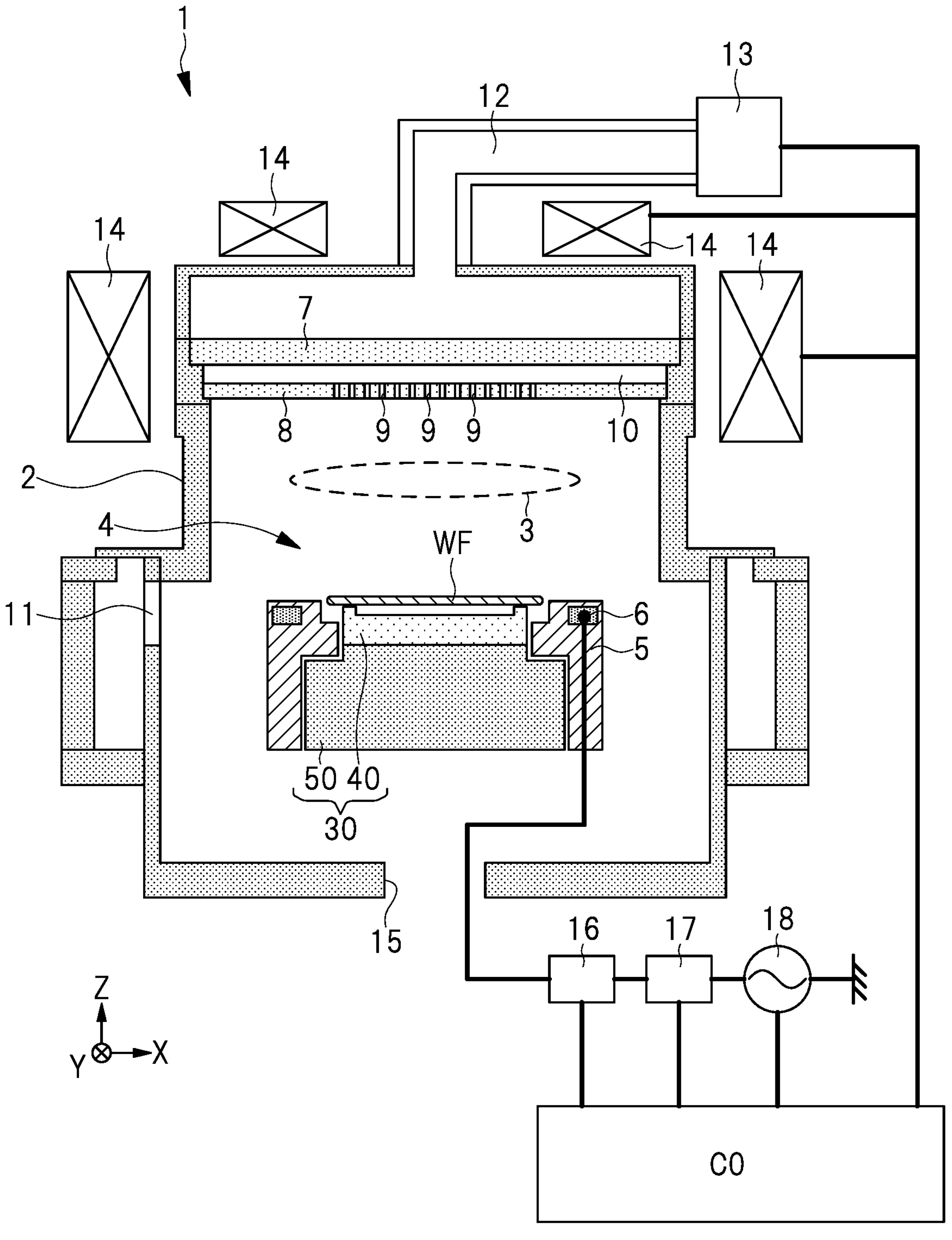
FIG. 1 is a schematic diagram illustrating a plasma processing apparatus according to a first embodiment.

An outline of a plasma processing apparatus 1 according to a first embodiment is described below with reference to FIG. 1.

The plasma processing apparatus 1 includes a cylindrical vacuum vessel 2, a processing chamber 4 provided inside the vacuum vessel 2, a cylindrical sample stage 30 provided inside the processing chamber 4, and a susceptor ring 5 attached to a lateral surface of the sample stage 30. The top part of the processing chamber 4 constitutes a discharge chamber, which is a space where plasma 3 is generated. A conductor ring 6 is provided inside the susceptor ring 5.

A disc-shaped window member 7 and a disc-shaped shower plate 8 are provided above the sample stage 30. The window member 7 is made of a dielectric material such as quartz or a ceramic, and hermetically seals the interior of the processing chamber 4. The shower plate 8 is provided below the window member 7 so as to be spaced apart from the window member 7 and is made of a dielectric material such as quartz. Further, the shower plate 8 is provided with a plurality of holes 9. A gap 10 is provided between the window member 7 and the shower plate 8, and processing gas is supplied to the gap 10 at the time of the plasma processing.

The sample stage 30 is used to place a wafer WF that is a workpiece at the time of the plasma processing on the wafer WF. The sample stage 30 is a member whose center axis in a vertical direction thereof is disposed at a position that is concentric or is approximately regarded to be concentric to the discharge chamber of the processing chamber 4 when viewed from above, and has a cylindrical shape.

Note that the wafer WF is configured to include all or a part of a semiconductor substrate made of silicon or others, a semiconductor element such as a transistor formed on the semiconductor substrate, and an insulating film and a wiring layer that are formed on the semiconductor element.

The space between the sample stage 30 and a bottom surface of the processing chamber 4 communicates with the space above the sample stage 30 via the gap between a lateral surface of the sample stage 30 and a lateral surface of the processing chamber 4. Therefore, the product, the plasma 3 or gas particles generated during the processing of the wafer WF placed on the sample stage 30 are discharged to the outside of the processing chamber 4 via the space between the sample stage 30 and the bottom surface of the processing chamber 4.

The sample stage 30 includes a basement 50 and an electrostatic chuck 40 provided on a top surface of the basement 50. The basement 50 and the electrostatic chuck 40 have a cylindrical shape. The main feature of the present application is structures of heaters HT1 and HT2 included in the electrostatic chuck 40, and such features will be described in detail later.

Note that the center of the basement 50 is convex, and the outer periphery of the basement 50 is concave. The electrostatic chuck 40 is provided on the top surface of the convex portion of the basement 50, and the susceptor ring 5 is provided on the top surface of the concave portion so as to surround the lateral surface of the convex portion and the lateral surface of the electrostatic chuck 40.

A portion of the vacuum vessel 2 is provided with a transfer port 11. By using a vacuum transfer apparatus such as a robot arm, the wafer WF can be transferred inside or outside the processing chamber 4 via the transfer port 11.

The plasma processing apparatus 1 includes a waveguide 12, a magnetron oscillator 13, and a solenoid coil 14. The waveguide 12 is provided above the window member 7, and a magnetron oscillator 13 is provided at one end of the waveguide 12. The magnetron oscillator 13 is capable of oscillating and outputting a microwave electric field. A frequency of the microwave electric field is not particularly limited, but is, for example, 2.45 GHz. The waveguide 12 is a conduit line through which the microwave electric field propagates, and the microwave electric field is supplied into the processing chamber 4 via the waveguide 12. The solenoid coil 14 is provided around the waveguide 12 and the processing chamber 4 and is used as means for generating a magnetic field.

The bottom surface of the processing chamber 4 is provided with a vacuum exhaust port 15. By using a turbo molecular pump and a dry pump, the interior of the processing chamber 4 can be exhausted via the vacuum exhaust port 15 in a pressure from atmospheric pressure to a vacuum state.

The plasma processing apparatus 1 includes a load impedance variable box 16, a load matching unit 17, and a high-frequency power source 18. The high-frequency power source 18 is electrically connected to the conductor ring 6 of the susceptor ring 5 via the load impedance variable box 16 and the load matching unit 17. Note that the high-frequency power source 18 is connected to a ground potential.

The alternating-current high voltage generated by the high-frequency power source 18 is introduced to the conductor ring 6. By the combination of the load impedance variable box 16 which is adjusted to have a suitable impedance value and the relatively high impedance portion disposed above the susceptor ring 5, an impedance value for high-frequency power to the outer peripheral portion of the wafer WF can be made relatively low. Thus, high-frequency power can be effectively supplied to the outer peripheral portion of the wafer WF, and the concentration of the electric field in the outer peripheral portion of the wafer WF can be moderated. Therefore, during the plasma processing, charged particles such as ions can be attracted to the upper surface of the wafer WF in a desired direction.

The plasma processing apparatus 1 includes a control unit C0. The control unit C0 is electrically connected to the magnetron oscillator 13, the solenoid coil 14, the load impedance variable box 16, the load matching unit 17, and the high-frequency power source 18, and controls their operation.

<Structure of Electrostatic Chuck>

The cross-sectional structure of the electrostatic chuck 40 is described in detail below with reference to FIGS. 2 and 3. FIG. 3 illustrates an enlarged part of the electrostatic chuck 40 in FIG. 2.

Figure 2:
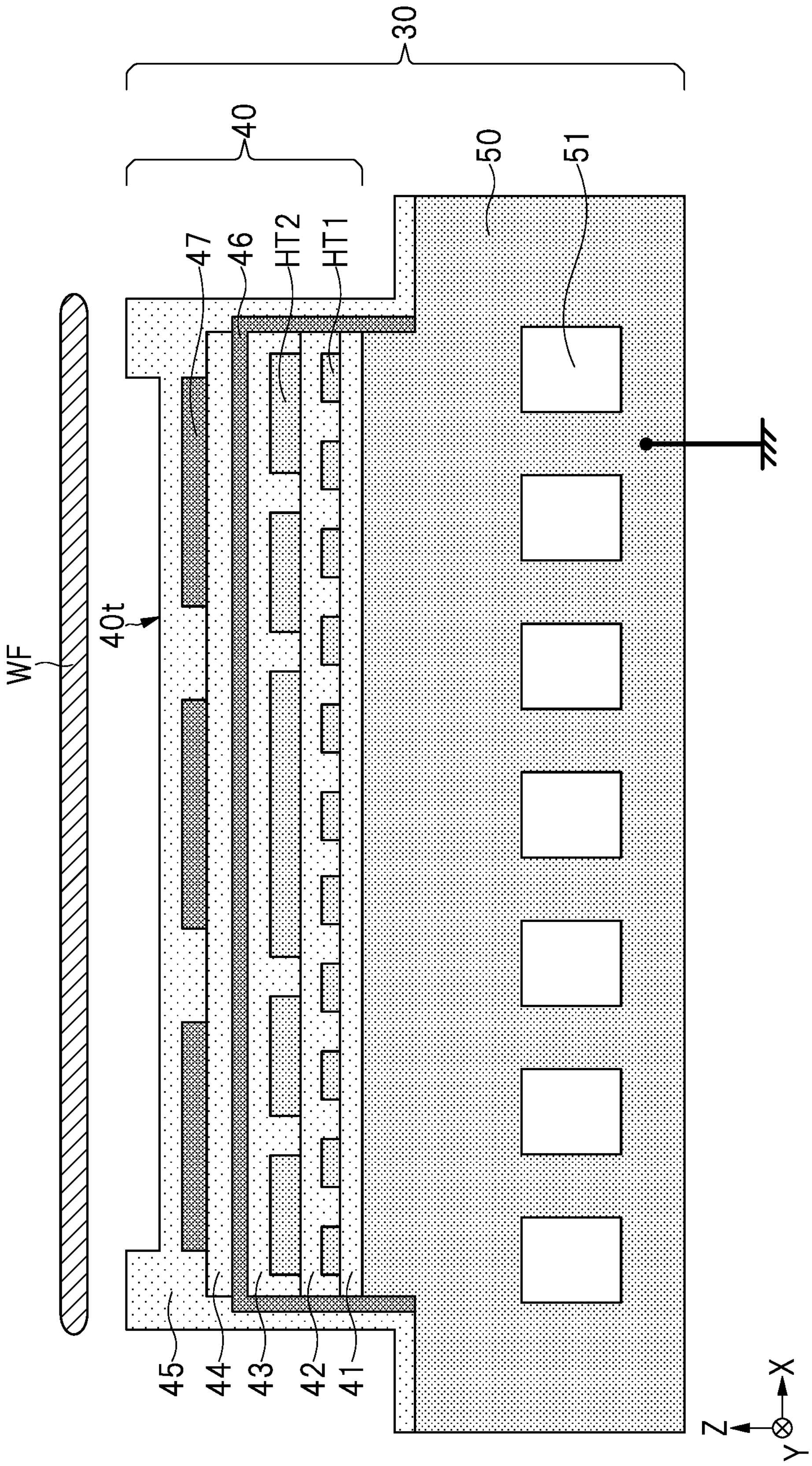
FIG. 2 is a cross-sectional view of a sample stage according to the first embodiment.
Figure 3:
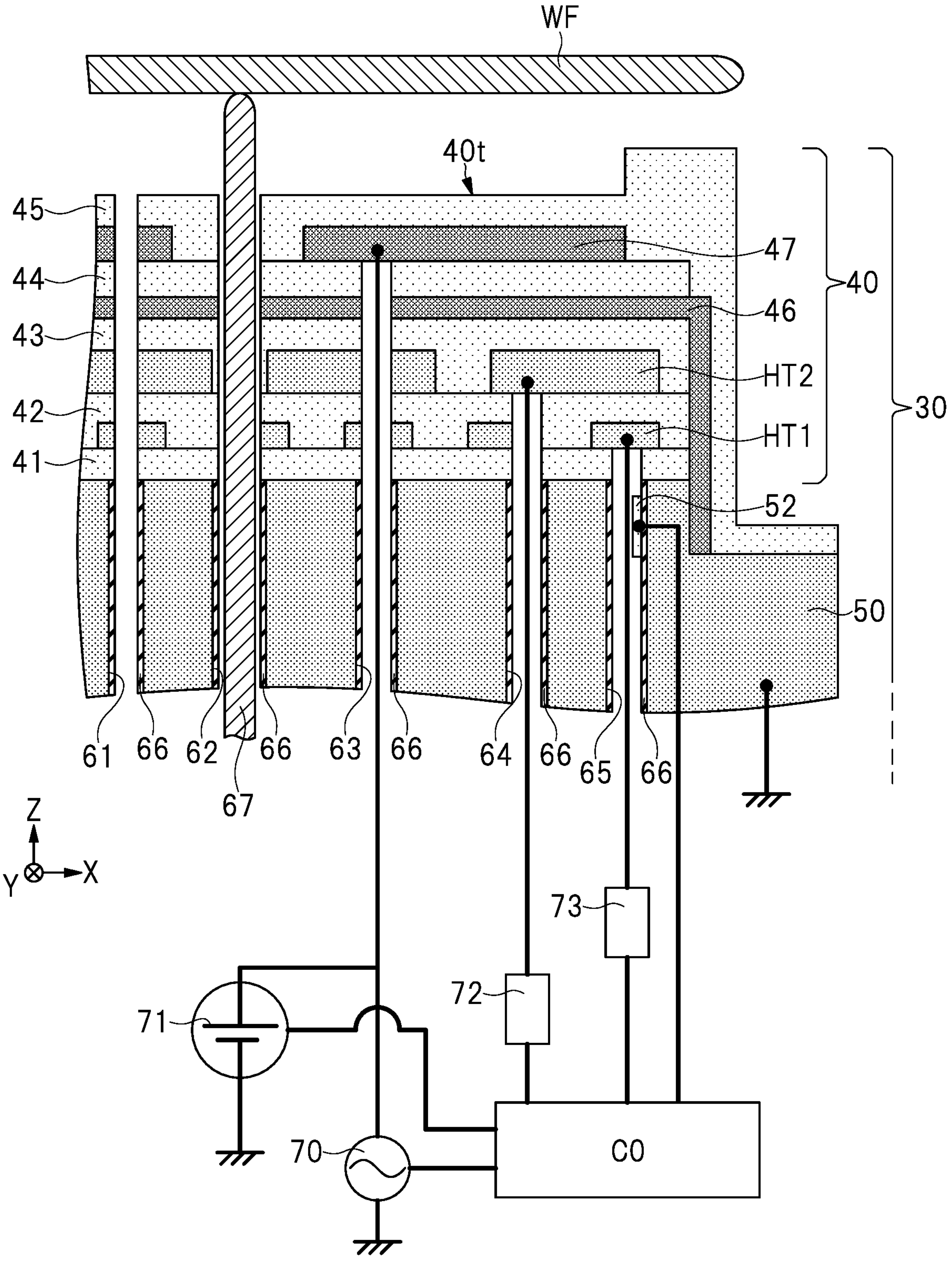
FIG. 3 is a cross-sectional view illustrating an enlarged part of the sample stage according to the first embodiment.

As illustrated in FIGS. 2 and 3, the basement 50 is made of a convex portion and a concave portion whose top surface is lower than a top surface of the convex portion. The basement 50 is also provided with concentrically or spirally overlapping cool flow paths 51.

The electrostatic chuck 40 has a heater HT1 and a heater HT2 that are covered by dielectric films 41 to 45, respectively. The dielectric film 41 is formed on the basement 50 (on the convex portion of the basement 50). The heater HT1 is formed on the dielectric film 41. The dielectric film 42 is formed on the dielectric film 41 so as to cover the heater HT1. The heater HT2 is formed on the dielectric film 42. The dielectric film 43 is formed on the dielectric film 42 so as to cover the heater HT2.

A shield film 46 is formed on the dielectric film 43. The shield film 46 also covers each lateral surface of the dielectric films 41 to 43 and the convex portion of the basement 50. In other words, the heaters HT1 and HT2 are covered by the shield film 46. The dielectric film 44 is formed on the shield film 46. Electrodes 47 are formed on the dielectric film 44. The dielectric film 45 is also formed on the dielectric film 44 so as to cover the electrodes 47. The dielectric film 45 is also formed on the top surface of the concave portion of the basement 50 so as to cover the shield film 46.

The basement 50 is made of a metallic material such as titanium or aluminum, or a compound thereof. Each of the dielectric films 41 to 45 is made of a dielectric material such as a ceramic, and is made of, for example, aluminum oxide. The shield film 46 is made of a material capable of blocking a high-frequency wave, and is made of a non-magnetic metallic material. The electrodes 47 are each made of a non-magnetic metallic material such as tantalum, tungsten or molybdenum.

A protrusion is provided on the outer peripheral portion of the dielectric film 45 in the top surface 40*t* of the electrostatic chuck 40 (the top surface of the dielectric film 45). The outer peripheral portion of the wafer WF is placed on this protrusion. At such time, a gap is provided between the bottom surface of the wafer WF and the top surface 40*t* of the electrostatic chuck 40.

The sample stage 30 has a hole 61 and a hole 62 that penetrate the basement 50 and the dielectric films 41 to 45. When the wafer WF is placed on the electrostatic chuck 40, a heat transfer gas such as helium (He) is supplied through the hole 61 to the gap between the bottom surface of the wafer WF and the top surface 40*t* of the electrostatic chuck 40. By the heat-transferable gas, a temperature change can be transferred from the electrostatic chuck 40 to the wafer WF.

A lift pin 67 that is movable in the vertical direction (the Z direction) is provided inside the hole 62. When the wafer WF is transported in and out, the wafer WF is placed on the lift pin 67 while the lift pin 67 is moved to an upper position than that of the protrusion of the top surface 40*t* of the electrostatic chuck 40. Then, by moving the lift pin 67 downward, the outer peripheral portion of the wafer WF is placed on the protrusion of the top surface 40*t* of the electrostatic chuck 40. Note that a plurality of holes 62 and lift pins 67 are provided to the sample stage 30 although not illustrated here.

The plasma processing apparatus 1 also includes a high-frequency power source 70, a direct-current power source 71, a direct-current power source 72, and a direct-current power source 73. The control unit C0 is electrically connected to the high-frequency power source 70, the direct-current power source 71, the DC power source 72, and the DC power source 73, and controls their operation.

A hole 63 that penetrates the basement 50 and the dielectric films 41 to 44 and that reaches the electrode 47 is formed in the sample stage 30. The electrode 47 is electrically connected to the high-frequency power source 70 and the direct-current power source 71 by a cable and a connector provided inside the hole 63. Note that the high-frequency power source 70 is connected to ground potential. A plurality of the electrodes 47 and the holes 63 are also formed on the sample stage 30.

When the wafer WF is placed on the electrostatic chuck 40, a direct-current voltage is supplied from the direct-current power source 71 to the plurality of electrodes 47. By this direct-current voltage, an electrostatic force that causes the wafer WF to be sucked and fixed to the top surface 40*t* of the electrostatic chuck 40 to hold the wafer WF can be generated inside the electrostatic chuck 40 and the wafer WF. Note that the plurality of electrodes 47 are point symmetric about the center axis of the sample stage 30 in the vertical direction, and voltages having different polarities are applied to the plurality of electrodes 47, respectively.

Furthermore, during the plasma processing of the wafer WF, high-frequency power having a predetermined frequency is supplied from the high-frequency power source 70 to the plurality of electrodes 47 in order to form an electric field to attract charged particles in the plasma onto the top surface of the wafer WF. The frequency of the high-frequency power source 70 is preferably the same as the frequency of the high-frequency power source 18 or is set to a value that is a constant multiple of the frequency of the high-frequency power source 18.

The shield film 46 is electrically connected to the basement 50. Because the basement 50 is fixed to ground potential, the shield film 46 is similarly fixed to ground potential. As a result, the inflow of the high-frequency wave to the heaters HT1 and HT2 can be suppressed.

A hole 64 that penetrates the basement 50 and the dielectric films 41 and 42 and that reaches the heater HT2 is formed in the sample stage 30. The heater HT2 is electrically connected to the direct-current power source 72 by a cable and a connector provided inside the hole 62.

A hole 65 that penetrates the basement 50 and the dielectric film 41 and that reaches the heater HT1 is formed in the sample stage 30. The heater HT1 is electrically connected to the direct-current power source 73 by a cable and a connector provided inside the hole 65. Note that the cables connected to the heaters HT1 and HT2 are not provided with a filter for the high-frequency power.

A temperature sensor 52 electrically connected to the control unit C0 is provided inside the basement 50, which is located below the heater HT1. The control unit C0 maintains the temperature detected by the temperature sensor 52 during plasma processing of the wafer WF. Note that a plurality of temperature sensors 52 are provided in accordance with the number of regions HT1*d* of the heater HT1 described later.

The inner walls of holes 61 to 65 are each provided with an insulation boss 66. The insulation boss 66 is made of an insulating material such as a ceramic material such as alumina or yttria or a resin material. During plasma processing of wafer WF, there is a risk of electric discharge occurring inside holes 61 to 65 due to the electric field caused by the high-frequency power. However, such a risk can be suppressed by the insulation boss 66.

<Detailed Structures of Heaters>

Figure 4:
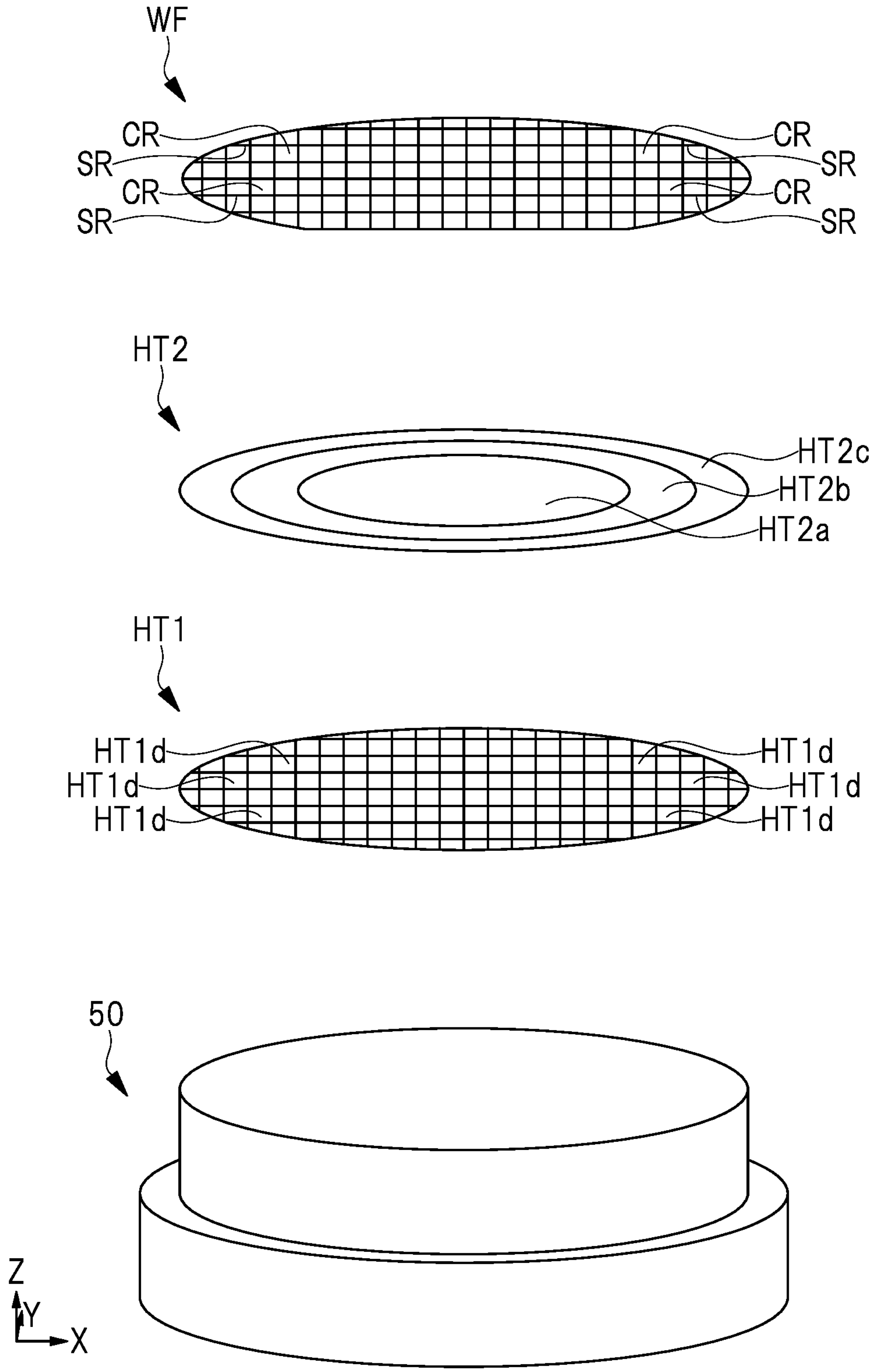
FIG. 4 is a bird's-eye view of the positional relationships between a wafer, two heaters, and a basement, according to the first embodiment.
Figure 5:
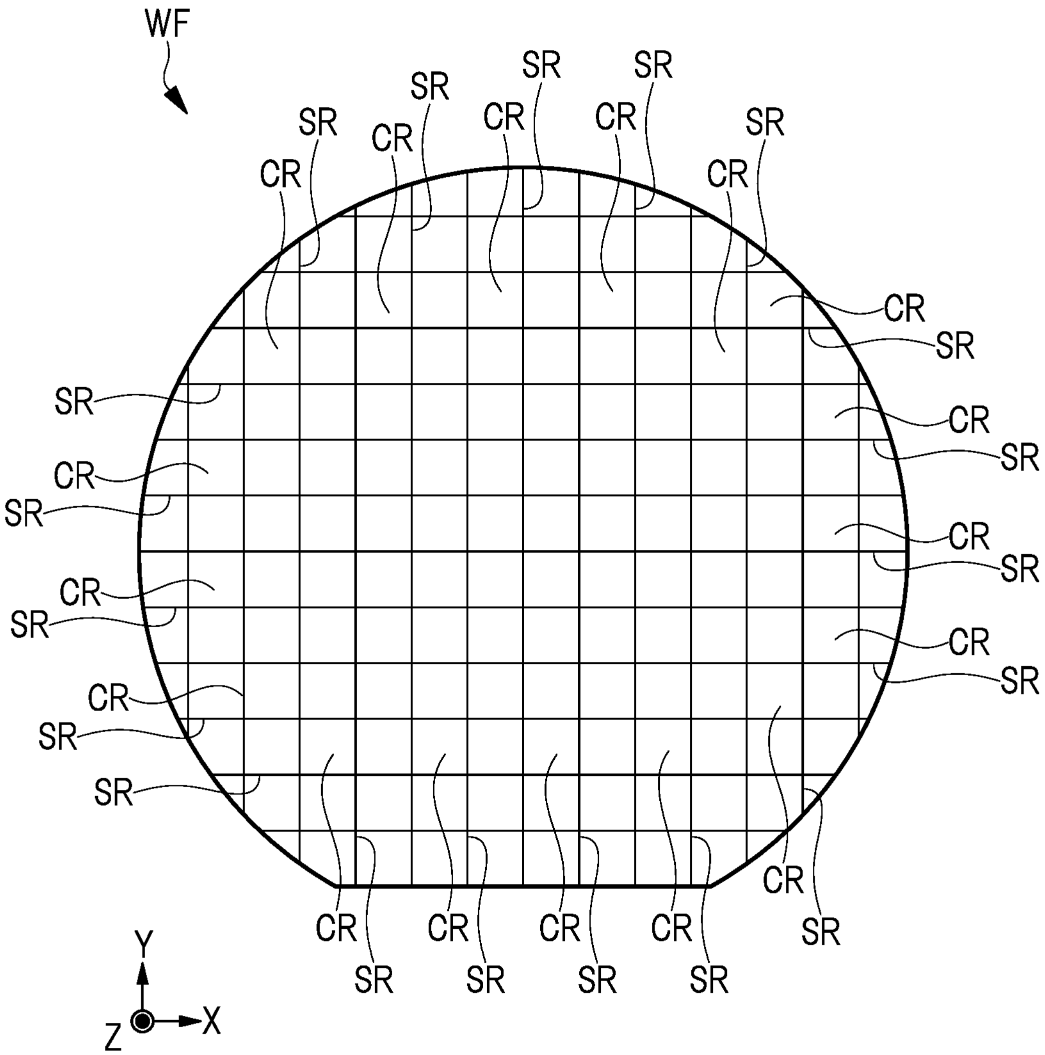
FIG. 5 is a plan view illustrating a wafer according to the first embodiment.
Figure 6:
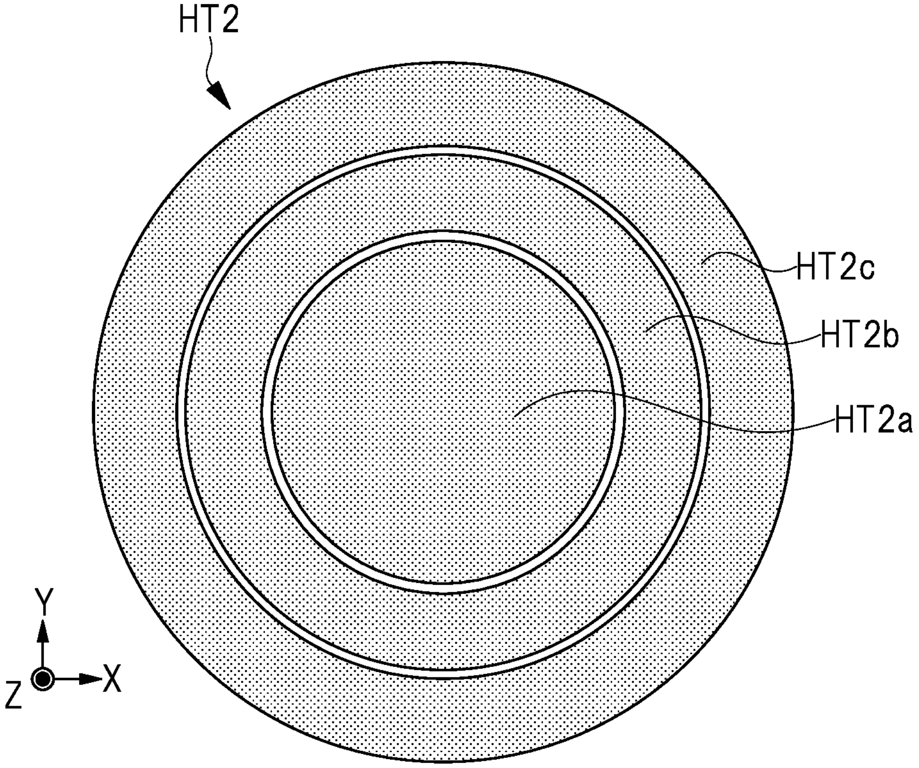
FIG. 6 is a plan view illustrating a heater of an upper-layer heater according to the first embodiment.
Figure 7:
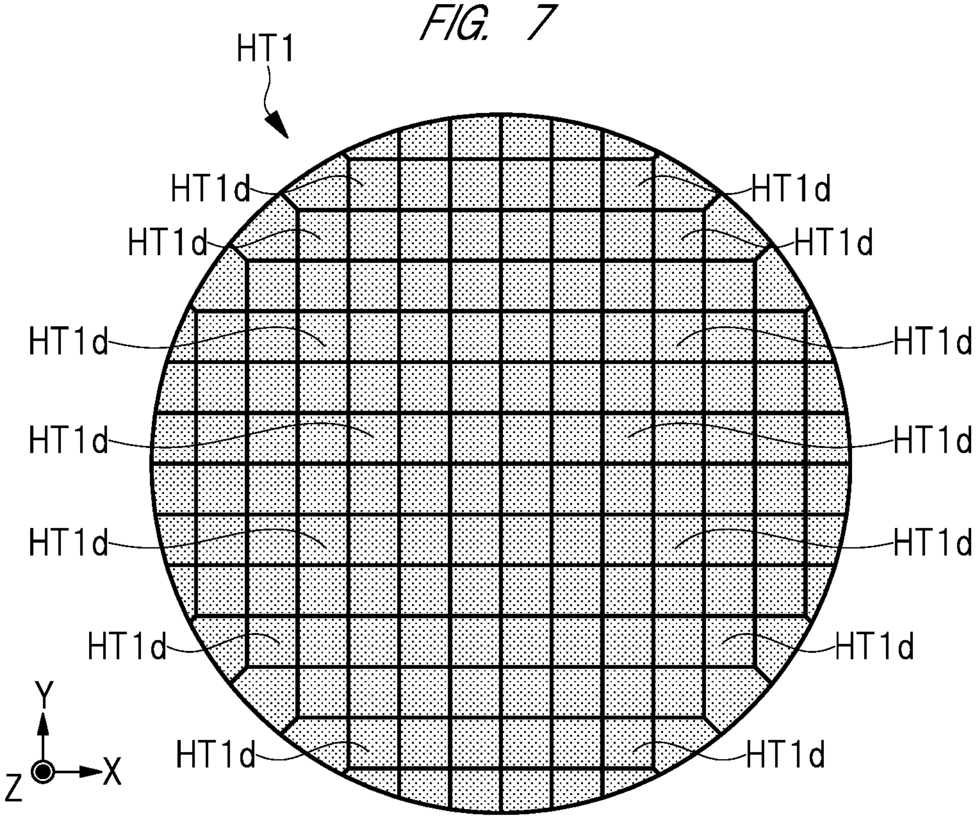
FIG. 7 is a plan view illustrating a heater of a lower-layer heater according to the first embodiment.
Figures 8, 9:
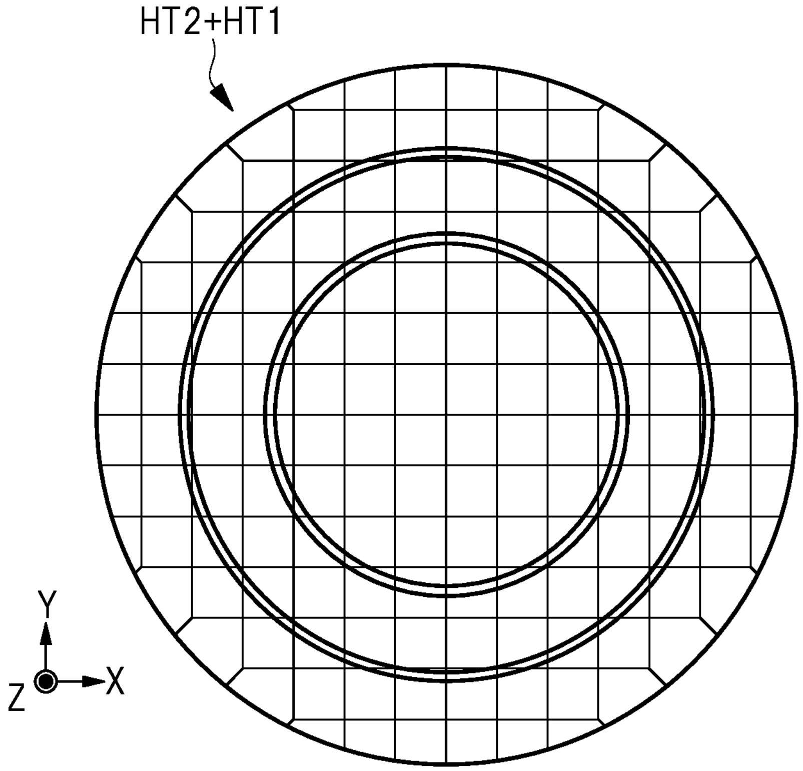
FIG. 8 is a plan view of two heaters overlapping on each other according to the first embodiment.
FIG. 9 is a table in comparison among the respective characteristics of the two heaters according to the first embodiment.

The detailed structures of the heaters HT1 and HT2 are described below with reference to FIGS. 4 to 9. FIG. 4 is a bird's-eye view illustrating the positional relationships among the wafer WF, the heater HT2, the heater HT1, and the basement 50. FIGS. 5 to 7 are plan views each illustrating the wafer WF, the heater HT2 and the heater HT1. FIG. 8 is a plan view of overlapping of heater HT1 and heater HT2.

As illustrated in FIG. 5, the wafer WF has a scribe region SR extending in the Y and X directions and a plurality of chip regions CR (a plurality of die regions) each surrounded by the scribe region SR. The plurality of chip regions CR each has a rectangular shape in plan view. Upon completion of all the steps of manufacturing the wafer WF, the wafer WF is cut along the scribe region SR by a dicing blade or the like, and the wafer WF is divided into pieces as a plurality of chip regions CR. In other words, the plurality of chip regions CR are regions which are actually shipped as products and where various semiconductor devices are formed.

The heater HT1 and the heater HT2 have a function capable of selectively changing the temperature for various regions of the wafer WF.

As illustrated in FIG. 6, the heater HT2 is divided into a region HT2*a* which is circular in plan view, a region HT2*b* which surrounds an outer periphery of the region HT2*a* in plan view, and a region HT2*c* which surrounds an outer periphery of the region HT2*b* in plan view. That is, the region HT2*b* has a ring shape having an inner diameter and an outer diameter larger than a radius of the region HT2*a*, and the region HT2*c* has a ring shape having an inner diameter and an outer diameter larger than an outer diameter of the region HT2*b*.

The regions HT2*a* to HT2*c* are individually electrically connected to the direct-current power source 72 illustrated in FIG. 3, respectively. Therefore, the control unit C0 is capable of individually controlling the supply of power to the regions HT2*a* to HT2*c*. As a result, the temperature of the regions of the wafer WF corresponding to the regions HT2*a* to HT2*c* is individually adjusted.

The main purpose of the heater HT2 is to achieve a uniform temperature in the circumferential direction in plan view and to control the temperature of the wafer WF in accordance with the reaction product distribution and the plasma density distribution during plasma processing.

As illustrated in FIG. 7, the heater HT1 is divided into a plurality of regions HT1*d*, each of which has a rectangular shape in plan view. The plurality of regions HT1*d* are adjacent to one another in the X and Y directions, and are arranged in a grid-like form.

The plurality of regions HT1*d* are individually electrically connected to the direct-current power source 73 illustrated in FIG. 3, respectively. Therefore, the control unit C0 is capable of individually controlling the supply of power to the regions HT1*d*. As a result, the temperature of the plurality of regions CR is individually adjusted. In other words, the plurality of regions HT1*d* are provided such that one region HT1*d* is located below one chip region CR. Therefore, by change of the supply of power to one region HT1*d*, the temperature of one chip region CR is changed.

The main purpose of the heater HT1 is to individually adjust the temperature for the plurality of chip regions CR during plasma processing to locally adjust the etching shape. Therefore, the heater HT1 is divided into, for example, 120 zones, whereas the heater HT2 is divided into three zones (regions HT2*a* to HT2*c*). In other words, the number of the plurality of regions HT1*d* is, for example, 120.

In the heater HT1, there are many power-feed lines connecting the plurality of direct-current power sources 73 and the plurality of regions HT1*d*, and hence there is a problem of easy occurrence of local increase of the number of regions (cold spots) where the temperature is lower than the set temperature. However, by the heater HT2, the temperature of cold spots can be corrected. Further, while the detailed region temperature control is not achieved by the heater HT2, such detailed region temperature control is achieved by the heater HT1.

Since the plasma processing apparatus 1 includes the heaters HT1 and HT2, the in-wafer temperature uniformity of the wafer WF can be increased.

Note that the regions HT2*a* to HT2*c* and the plurality of regions HT1*d* indicate regions to be heaters, and do not indicate the shape of the conductors themselves that constitute the heaters. Specifically, each of the regions HT2*a* to HT2*c* and the plurality of regions HT1*d* is configured by arranging a heater wire to fold plural times. The heater wire is made of a metallic material such as titanium, tungsten or molybdenum.

FIG. 9 is a table for comparison between the characteristics of the heater HT1 with the characteristics of the heater HT2. The heating surface area of the heater HT2 is larger than the heating surface area of the heater HT1. However, the heater HT1 is divided into a plurality of regions HT1*d*, and hence the number of power-feed lines increases, and the current amount is larger. The large current amount causes a risk of apparatus damage such as melting or thermal deformation due to heat generation when the power-feed lines have contact resistance. Furthermore, the many power-feed lines cause a risk of heat generation of the power-feed lines themselves. If such heating points are densely located, the effect cannot be ignored, and it undesirably becomes necessary to make contrivance to take into account the heat removal inside the electrostatic chuck 40. As described above, in the heater HT1, it is necessary to make contrivance to increase the resistance value and decrease the current amount.

On the other hand, the heater HT2 has a large surface area, and a length of the arranged heater wire is large, and therefore, the resistance value tends to be high. As a result, the current amount is small, and hence it is necessary to make contrivance to decrease the resistance value.

In consideration of the above description, the following relationship preferably exists between the structure of the heater wires constituting the heater HT1 (the plurality of regions HT1*d*) and the heater HT2 (the regions HT2*a* to HT2*c*). In this case, note that the material of the heater wires constituting the heater HT1 is the same as the material of the heater wires constituting the heater HT2.

The thickness of the heater wires constituting the heater HT2 is thicker than the thickness of the heater wires constituting the heater HT1. The line width of the heater wires constituting the heater HT2 is wider than the line width of the heater wires constituting the heater HT1. These relationships are more preferably both satisfied.

In addition, as illustrated in FIG. 8, there are a plurality of locations where one region HT1*d* straddles two of the regions HT2*a* to HT2*c*. In such locations, the supplied power is adjusted in consideration of the temperature of each of the regions HT2*a* to HT2*c* and the region HT1*d* and the amount of power around the corresponding region HT1*d*.

Further, the outermost region HT1*d* of the heater HT1 has a distorted shape. If the temperature is controlled in the distorted shape, the outermost peripheral portion of the wafer WF is difficult to maintain the uniformity. Thus, by the temperature control using the region HT2*c*, the temperature variation in the outermost peripheral portion of the wafer WF can be reduced. Furthermore, if the chip region CR is also to be formed in the outermost peripheral portion of the wafer WF, the region has a distorted shape. Therefore, practically, the outermost peripheral portion of the wafer WF is a region where the semiconductor device is not formed and is a region which is not shipped as a product. Thus, even if the outermost region HT1*d* of the heater HT1 has the distorted shape so that the temperature varies in the outermost peripheral portion of the wafer WF, there is no significant influence on the manufacturing yield of the wafer WF.

<Plasma Processing Method>

Figure 10:
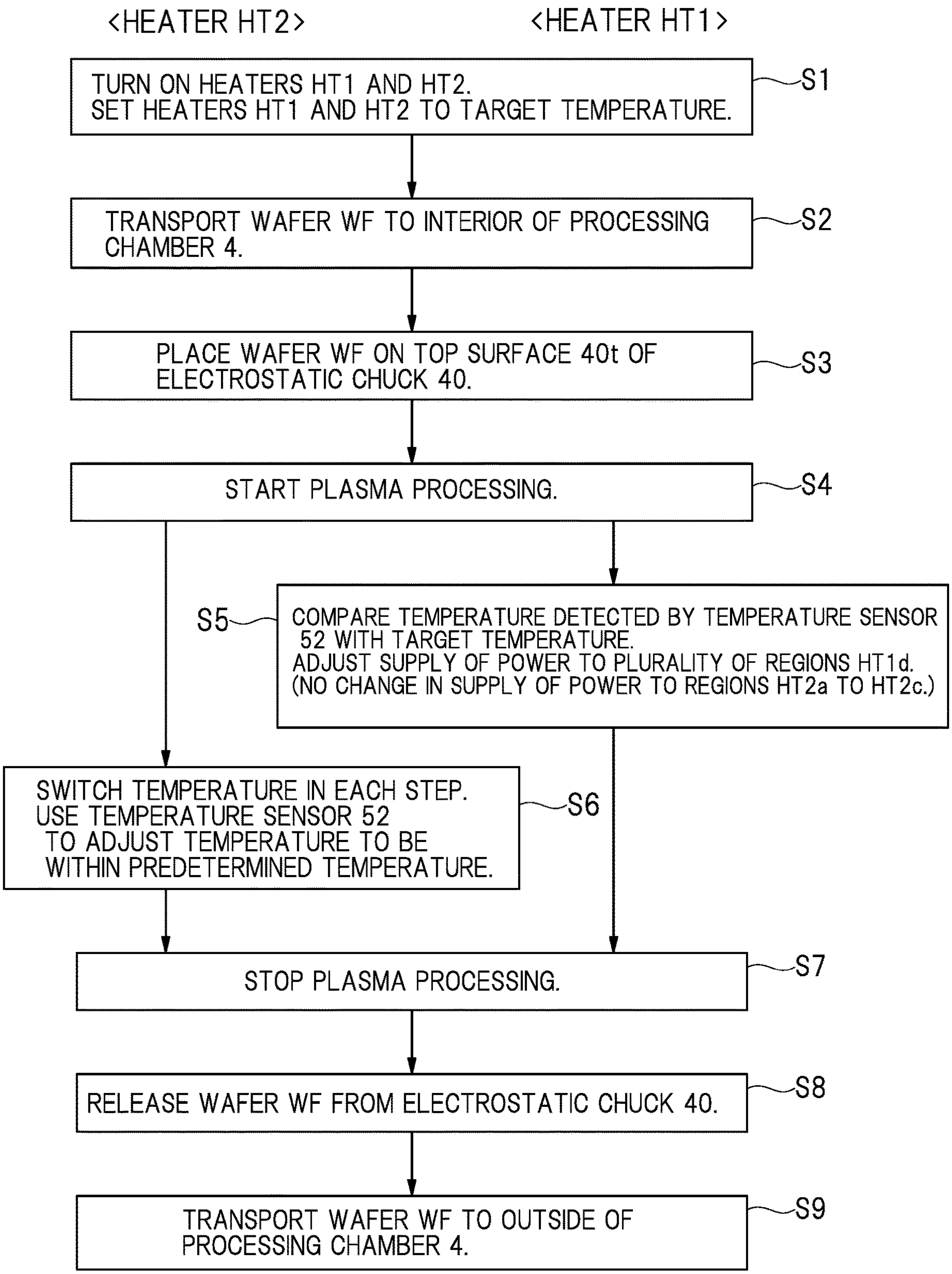
FIG. 10 is a flowchart illustrating a plasma processing method according to the first embodiment.

As an example of a plasma processing method, FIG. 10 illustrates a method of executing an etching processing using the plasma 3 on a predetermined film previously formed on the top surface of the wafer WF.

First, in step S1, in accordance with an instruction from the control unit C0, a direct-current voltage is supplied from the direct-current power sources 72 and 73 to the heaters HT1 and HT2 to turn ON the heaters HT1 and HT2. Before plasma processing is performed, the supply of power is set such that the target temperature is reached in the heater HT2 (the regions HT2*a* to HT2*c*) and the heater HT1 (the region HT1*d*).

In step S2, the pressure inside the vacuum transport vessel connected to the lateral wall of the vacuum vessel 2 is reduced to the same pressure as that of the processing chamber 4. The wafer WF is placed from outside the plasma processing apparatus 1 onto the tip portion of the arm of a vacuum transport apparatus such as a robot arm, and is transported to the interior of the vacuum transport vessel. By opening the transfer port 11, the wafer WF is transported from the interior of the vacuum transport vessel to the interior of the processing chamber 4 and is placed on the sample stage 30. When the arm of the vacuum transport apparatus exits the processing chamber 4, the interior of the processing chamber 4 is sealed.

In step S3, a direct-current voltage is supplied from the direct-current power source 71 to the electrode 47, and the wafer WF is held on the top surface 40*t* of the electrostatic chuck 40 by the electrostatic force generated. In this state, a heat-transferable gas such as helium (He) is supplied through the hole 61 to the gap between the wafer WF and the top surface 40*t* of the electrostatic chuck 40. In addition, a refrigerant adjusted to a predetermined temperature by a refrigerant temperature regulator not illustrated is supplied to the flow paths 51 for refrigerant. Accordingly, heat transfer is promoted between the wafer WF and the basement 50 whose temperature has been adjusted, and the temperature of the wafer WF is adjusted to a value within a range appropriate for starting the plasma processing.

In step S4, a processing gas, whose flow rate and velocity are adjusted by a gas supply apparatus not illustrated, is supplied to a gap 10 and is dispersed inside the gap 10. The dispersed processing gas is supplied through the plurality of holes 9 to an upper side of the sample stage 30. The processing gas is supplied into the processing chamber 4, and the interior of the processing chamber 4 is vacuum-exhausted through the vacuum exhaust port 15. Based on the balance between the supply and the exhaust, the pressure inside the processing chamber 4 is adjusted to a value within the range suitable for plasma processing.

In this state, a microwave electric field is oscillated from the magnetron oscillator 13. The microwave electric field propagates inside the waveguide 12 and is transmitted through the window member 7 and shower plate 8. Furthermore, the magnetic field generated by the solenoid coil 14 is supplied to the processing chamber 4. The interaction between the magnetic field and the microwave electric field generates electron cyclotron resonance (ECR). The atoms or molecules of the processing gas are then excited, ionized or dissociated, and thus the plasma 3 is generated inside the processing chamber 4.

By the generation of the plasma 3, the high-frequency power is supplied from the high-frequency power source 70 to the electrodes 47 to form a bias potential on the top surface of the wafer WF, and the charged particles such as ions in the plasma 3 are attracted to the top surface of the wafer WF. As a result, plasma processing (etching processing) is performed on the predetermined film of the wafer WF so as to follow the pattern shape of the mask layer.

In step S5, the control unit C0 compares the difference between the temperature detected by the plurality of temperature sensors 52 during plasma processing on the wafer WF and the target temperature previously set for the plurality of regions HT1*d* in step S1. The control unit C0 then individually controls the supply of power to the plurality of regions HT1*d* so as to minimize the difference. Here, the control unit C0 individually controls the supply of power to only the plurality of regions HT1*d* without changing the supply of power to the regions HT2*a* to HT2*c*. As a result, the temperature of the chip regions CR corresponding to the regions HT1*d* whose supply of power is changed is individually adjusted.

In step S6, the target of the etching process is shifted to other film. Hence, the control unit C0 changes the supply of power to the regions HT2*a* to HT2*c* in order to change the temperature to a temperature suitable for the other film. The changed temperature is detected by the plurality of temperature sensors 52 and is transmitted to the control unit C0. The control unit C0 adjusts the supply of power to the regions HT2*a* to HT2*c* to adjust the in-wafer temperature of the wafer WF so that an error in the changed temperature is within a predetermined temperature.

Here, in the heater HT1, the same processing as in step S5 is performed. That is, the supply of power to the plurality of regions HT1*d* is individually controlled to individually adjust the temperature of the plurality of chip regions CR.

Thereafter, in step S7, if there is no need for further etching processing on the wafer WF, the supply of processing gas to the gap 10 is stopped, the oscillation of microwaves from the magnetron oscillator 13 is stopped, and the supply of high-frequency power from the high-frequency power source 70 is stopped. As a result, the plasma processing is stopped. In step S8, the static electricity is removed, and the wafer WF is released from suction. In step S9, the arm of the vacuum transport apparatus enters the processing chamber 4, and the processed wafer WF is transported to the outside of the plasma processing apparatus 1.

Thus, by the plasma processing (etching processing) using the plasma processing apparatus 1, the uniformity of the in-wafer temperature of the wafer WF can be increased, and thus, the decrease in the manufacturing yield of the wafer can be suppressed.

In the foregoing, the present invention has been concretely described on the basis of the embodiments. However, the present invention is not limited to the foregoing embodiments, and various modifications can be made within the scope of the present invention.

EXPLANATION OF REFERENCE SIGNS

1 Plasma processing apparatus
2 Vacuum vessel
3 Plasma
4 Processing chamber
5 Susceptor ring
6 Conductor ring
7 Window member
8 Shower plate
9 Hole
10 Gap
11 Transport port
12 Waveguide
13 Magnetron oscillator
14 Solenoid coil
15 Vacuum exhaust port
16 Load impedance variable box
17 Load matching unit
18 High-frequency power source
30 Sample stage
40 Electrostatic chuck
**40*t*** Top surface
41 to 45 Dielectric film
46 Shield film
47 Electrode
50 Basement
51 Flow path for refrigerant
52 Temperature sensor
61 to 65 Hole
66 Insulation boss)
67 Lift pin
70 High-frequency power source
71 direct-current power source
72 direct-current power source
73 direct-current power source
C0 Control unit
CR Chip region
HT1 Heater
HT1*d* Region
HT2 Heater
HT2*a* to HT2*c* Region
SR Scribe region
WF Wafer

The invention claimed is:

1. A plasma processing apparatus comprising:
a vacuum vessel;
a processing chamber provided inside the vacuum vessel;
a cylindrical sample stage provided to the processing chamber on which a wafer to be processed is located; wherein
the sample stage includes a basement connected to ground potential and an electrostatic chuck that is provided on a top surface of the basement, and an electrode to which radio frequency power is supplied during the processing of the wafer located on the sample stage,
the electrostatic chuck has a dielectric film covering an upper surface of the basement, a first heater and a second heater which adjust the temperature of the wafer by heating during the processing of the wafer, each of the first heater and the second heater being covered by the dielectric film, and a metal film disposed above the dielectric film and covers the first and second heaters and is connected to the ground potential,
the second heater is provided above the first heater,
the second heater is divided into a first region having a circular shape in plan view, a second region surrounding an outer periphery of the first region in plan view, and a third region surrounding an outer periphery of the second region in plan view,
the first heater is divided into a plurality of fourth regions, each having a rectangular shape in plan view,
each of the first region, the second region, the third region, and the plurality of fourth regions is electrically connected to each of a plurality of Direct Current (DC) power supplies which are each configured to supply individually adjusted power during the processing of the wafer, and
the plasma processing apparatus further comprises a plurality of supply paths of DC power, each supply path being connected between each of the first region, the second region, the third region, and the plurality of fourth regions, and each of the plurality of DC power supplies is without a filter.

2. The plasma processing apparatus according to claim 1, the water has a scribe region, and a plurality of chip regions each surrounded by the scribe region and each having a rectangular shape in plan view, and, when the plasma processing apparatus is configured to individually control the supply of power to the plurality of fourth regions, a temperature of the plurality of chip regions is individually adjusted.

3. The plasma processing apparatus according to claim 2, wherein the plurality of fourth regions are provided such that one of the fourth regions is located below one of the chip regions when the wafer is placed on the top surface of the electrostatic chuck.

4. The plasma processing apparatus according to claim 2, further comprising:

a plurality of temperature sensors, each of which is provided inside the basement located below the plurality of fourth regions, and electrically connected to the control unit, wherein the control unit is configured to compare a difference between temperatures detected by the plurality of temperature sensors during plasma processing on the wafer and target temperatures previously set for the plurality of fourth regions before the plasma processing is performed, and individually control the supply of power to the plurality of fourth regions so as to minimize the difference.

5. The plasma processing apparatus according to claim 4, wherein, during the processing of the wafer, the supply of power to each of the plurality of fourth regions is adjusted individually without changing the supply of power to the first region, the second region, and the third region.

6. The plasma processing apparatus according to claim 1, wherein the first region, the second region, the third region, and the plurality of fourth regions are each configured by arranging a heater wire made of a metallic material to fold plural times, and a thickness of the heater wires constituting the first region, the second region, and the third region is larger than a thickness of the heater wires constituting the plurality of fourth regions.

7. The plasma processing apparatus according to claim 6, wherein a wire width of the heater wires constituting the first region, the second region, and the third region is larger than a wire width of the heater wires constituting the plurality of fourth regions.

8. The plasma processing apparatus according to claim 1, wherein the sample stage further includes at least one through hole having an opening on the upper surface of the electrostatic chuck and penetrating both of the dielectric films and the basement inside of which at least one of the DC power supply path, the radio frequency power supply path for the electrode, or a lift pin in order to raise or lower the wafer above the upper surface of the electrostatic chuck are disposed, and a dielectric cylindrical member constituting an inner surface of the through hole.

* * * * *